United States Patent
Ohta et al.

(10) Patent No.: US 8,389,123 B2
(45) Date of Patent: Mar. 5, 2013

(54) MATERIAL FOR FORMING ELECTROLESS PLATE, COATING SOLUTION FOR ADHERING CATALYST, METHOD FOR FORMING ELECTROLESS PLATE, AND PLATING METHOD

(75) Inventors: Tetsuji Ohta, Tokyo (JP); Keiko Kitamura, Saitama (JP); Mitsuhiro Watanabe, Yokosuka (JP)

(73) Assignees: Kimoto Co., Ltd. (JP); Japan Surface Treatment Institute Co., Ltd. (JP)

( * ) Notice: Subject to any disclaimer, the term of this patent is extended or adjusted under 35 U.S.C. 154(b) by 755 days.

(21) Appl. No.: 12/525,374

(22) PCT Filed: Feb. 1, 2008

(86) PCT No.: PCT/JP2008/051636
§ 371 (c)(1),
(2), (4) Date: Jul. 31, 2009

(87) PCT Pub. No.: WO2008/096670
PCT Pub. Date: Aug. 14, 2008

(65) Prior Publication Data
US 2010/0108528 A1    May 6, 2010

(30) Foreign Application Priority Data
Feb. 7, 2007   (JP) ................. 2007-027554

(51) Int. Cl.
*B32B 27/00* (2006.01)
*C25D 5/54* (2006.01)

(52) U.S. Cl. ....................................... 428/500; 205/163
(58) Field of Classification Search .................. None
See application file for complete search history.

(56) References Cited

U.S. PATENT DOCUMENTS

| | | | | |
|---|---|---|---|---|
| 4,832,989 | A | 5/1989 | Giesecke et al. | 427/306 |
| 8,206,828 | B2 * | 6/2012 | Ohta et al. | 428/423.1 |
| 2003/0138635 | A1 * | 7/2003 | Haruta et al. | 428/413 |
| 2006/0056684 | A1 | 3/2006 | Kurane | 382/162 |
| 2009/0075089 | A1 * | 3/2009 | Ohta et al. | 428/423.1 |

FOREIGN PATENT DOCUMENTS

| | | | |
|---|---|---|---|
| JP | 62-146278 | 6/1987 | |
| JP | 2002-220677 | 8/2002 | |
| JP | 2006-066180 | 3/2006 | |
| JP | 2006-080942 | * | 3/2006 |

* cited by examiner

*Primary Examiner* — Sheeba Ahmed
(74) *Attorney, Agent, or Firm* — Bacon & Thomas, PLLC

(57) ABSTRACT

A material for forming electroless plate comprising a non-conductive base material and a catalyst adhering layer provided on the non-conductive base material is constituted so that the catalyst adhering layer should comprise a hydrophilic (meth)acrylic resin constituted with a hydrophilic monomer and a hydrophobic monomer and containing the hydrophobic monomer at a ratio of 50 to 90 mol %. This material for forming electroless plate shows favorable catalyst adhering property, and shows no delamination of the catalyst adhering layer from the non-conductive base material, no dissolution of the catalyst adhering layer into a plating solution, and no discoloration of plate layer during the catalyst adhering step, development step and other steps.

14 Claims, No Drawings

MATERIAL FOR FORMING ELECTROLESS PLATE, COATING SOLUTION FOR ADHERING CATALYST, METHOD FOR FORMING ELECTROLESS PLATE, AND PLATING METHOD

TECHNICAL FIELD

The present invention relates to a material for forming electroless plate, which is formed by subjecting a non-conductive base material to a treatment enabling electroless plating.

BACKGROUND ART

Electroless plating is widely used as an industrial technique which can change non-conductive base material surfaces such as those of plastics, ceramics, paper, glass, and fibers into conductive surfaces. Especially when a surface of non-conductive base material is to be electrolytically plated, the non-conductive base material is electrolessly plated as a pretreatment for the electrolytic plating.

However, it is difficult to form electroless plate directly on a surface of non-conductive base material. This is because it is difficult to adhere a catalyst layer as a pretreatment for electroless plating to a base material surface, since the non-conductive base material has a smooth surface.

Therefore, surface of the non-conductive base material is conventionally roughened by a mechanical treatment or chemical treatment to enable adhesion of a catalyst to the base material surface. However, if surface of the base material is roughened, the material as a whole becomes opaque, and therefore there arises a problem that the material becomes unsuitable for use requiring transparency.

As means for solving this problem, there has been proposed a means for forming a gelatinous thin membrane containing a water-soluble polymer (catalyst adhering layer) on a non-conductive base material (Patent document 1).

Patent document 1: Japanese Patent Unexamined Publication (KOKAI) No. 2002-220677 (claims)

DISCLOSURE OF THE INVENTION

Object to be Achieved by the Invention

However, in the method of Patent document 1, although the gelatinous thin membrane adheres the catalyst, the gelatinous thin membrane may be delaminated or dissolved from the non-conductive base material, when the gelatinous thin membrane is immersed in a catalyst bath in the catalyst adhering step or when a developer is brought into contact with the gelatinous thin membrane in the development step after the electrolytic plating.

As means for solving this problem, it is conceivable to use a means of curing the gelatinous thin membrane to improve durability thereof to solvents used for the catalyst bath or developer. However, if the gelatinous thin membrane is cured, adhesion between the gelatinous thin membrane and the non-conductive base material is degraded, and thus the phenomenon of delamination of the gelatinous thin membrane from the non-conductive base material in the catalyst adhering step, development step and other steps cannot be sufficiently prevented.

As means for solving the aforementioned problem, the inventors of the present invention developed a material for forming electroless plate comprising a non-conductive base material as well as a curable layer formed from a resin having hydroxyl group and an isocyanate type compound and a catalyst adhering layer formed from a hydrophilic and/or water-soluble resin containing hydroxyl group, which are provided on the non-conductive base material (Japanese Patent Application No. 2006-80942, WO2007/108351).

However, although the material for forming electroless plate of Japanese Patent Application No. 2006-80942 solves the aforementioned problem, it has a drawback that interface of the plate layer with the catalyst adhering layer blackly discolors. This discoloration is conspicuous especially when the non-conductive base material is transparent, and the material is observed from the base material side.

Therefore, an object of the present invention is to provide a material for forming electroless plate which shows good adhesion for a catalyst and does not show delamination of a catalyst adhering layer from a non-conductive base material or dissolution of the same into a plating solution, and no discoloration of the interface of the plate layer with the catalyst adhering layer in a catalyst adhering step, development step and other steps.

Means for Achieving the Object

The material for forming electroless plate of the present invention, with which the aforementioned object is achieved, is a material for forming electroless plate comprising a non-conductive base material and a catalyst adhering layer provided on the non-conductive base material, wherein the catalyst adhering layer comprises a hydrophilic (meth)acrylic resin constituted with a hydrophilic monomer and a hydrophobic monomer and containing the hydrophobic monomer at a ratio of 50 to 90 mol %.

In the material for forming electroless plate of the present invention, at least one of the hydrophilic monomer and the hydrophobic monomer is preferably a self-crosslinkable monomer.

In the material for forming electroless plate of the present invention, the hydrophilic monomer is preferably a (meth)acrylate having hydroxyl group or N-methylol(meth)acrylamide.

In the material for forming electroless plate of the present invention, the hydrophobic monomer is preferably an alkyl (meth)acrylate.

In the material for forming electroless plate of the present invention, the hydrophilic (meth)acrylic resin is preferably a comb resin.

In the material for forming electroless plate of the present invention, the catalyst adhering layer preferably contains the hydrophilic (meth)acrylic resin in an amount of 50% by weight or more of the total resin constituting the catalyst adhering layer.

The coating solution for adhering catalyst of the present invention is a coating solution for adhering catalyst for adhering a catalyst for electroless plating to a non-conductive base material, which comprises a hydrophilic (meth)acrylic resin constituted with a hydrophilic monomer and a hydrophobic monomer and containing the hydrophobic monomer at a ratio of 50 to 90 mol %.

The method for forming an electroless plate of the present invention comprises adhering a catalyst to the catalyst adhering layer of the material for forming electroless plate of the present invention, and then performing electroless plating.

The plating method of the present invention comprises a step (1) of adhering a catalyst to a catalyst adhering layer of a material for forming electroless plate comprising a non-conductive base material and the catalyst adhering layer provided on the non-conductive base material, a step (2) of immersing the material for forming electroless plate adhered with the catalyst in an electroless plating solution containing a compound of a metal to be plated and performing electroless plating, and a step (3) of immersing the material for forming electroless plate on which electroless plate is formed in an electrolytic plating bath and performing electrolytic plating by electrifying it, wherein the material for forming electroless plate of the present invention is used as the material for forming electroless plate.

The plating method of the present invention comprises a step (1) of adhering a catalyst to a catalyst adhering layer of a material for forming electroless plate comprising a non-conductive base material and the catalyst adhering layer provided on the non-conductive base material, a step (2) of immersing the material for forming electroless plate adhered with the catalyst in an electroless plating solution containing a compound of a metal to be plated and performing electroless plating, and a step (3) of immersing the material for forming electroless plate on which electroless plate is formed in an electrolytic plating bath and performing electrolytic plating by electrifying it, wherein a material for forming electroless plate in which a catalyst adhering layer is formed by applying the coating solution for adhering catalyst of the present invention on a surface of a non-conductive base material is used as the material for forming electroless plate.

The plating method of the present invention preferably comprises a step (4) of heating the material for forming electroless plate to advance crosslinking of the hydrophilic (meth) acrylic resin. The step (4) is preferably performed after the step (1) and before the step (3).

Effect of the Invention

In the material for forming electroless plate of the present invention, the catalyst adhering layer comprises a hydrophilic (meth)acrylic resin constituted with a hydrophilic monomer and a hydrophobic monomer and containing the hydrophobic monomer at a ratio of 50 to 90 mol %. Therefore, it shows favorable catalyst adhering performance, does not show delamination of the catalyst adhering layer from the non-conductive base material or dissolution of the same into a plating solution, and shows no discoloration of the plate layer.

Moreover, according to the method for forming electroless plate of the present invention, an electroless plate can easily be formed on a non-conductive base material in a short period of time, and the catalyst adhering layer on the non-conductive base material does not delaminate during the operation.

BEST MODE FOR CARRYING OUT THE INVENTION

Hereafter, embodiments of the material for forming electroless plate of the present invention will be explained. The material for forming electroless plate of the present invention comprises a non-conductive base material and a catalyst adhering layer formed on the non-conductive base material.

Examples of the non-conductive base material include plastic films such as those of polyester, ABS (acrylonitrile/butadiene/styrene), polystyrene, polycarbonate, acrylic resin, liquid crystal polymer (LCP), polyolefin, cellulose resin, polysulfone, polyphenylene sulfide, polyethersulfone, polyetheretherketone and polyimide, those made of glass, ceramics, paper, fibers, and so forth. Among these, transparent base materials such as those made of plastics and glass can be preferably used, since such transparent base materials enable observation of favorable metallic luster from the non-conductive base material side after formation of plate. The non-conductive base material is not limited to those having a flat shape, and it may have a three-dimensional shape.

The non-conductive base material may be one subjected to an adhesion promoting treatment for enhancing adhesion to the catalyst adhering layer. Examples of the adhesion promoting treatment include corona discharge treatments, plasma treatments, and so forth.

When the non-conductive base material may be opaque, a base material having a roughened surface may also be used. If the surface of the base material is roughened, the surface of the catalyst adhering layer can be roughened by the surface roughness of the base material, and adhesion of the catalyst can be thereby made easier.

The catalyst adhering layer plays a role of adhering fine metal particles having a catalytic activity for electroless plating (catalyst). In the present invention, a layer comprising a hydrophilic (meth)acrylic resin constituted with a hydrophilic monomer and a hydrophobic monomer and containing the hydrophobic monomer at a ratio of 50 to 90 mol % is used as such a catalyst adhering layer.

As the hydrophilic monomer, monomers having a polymerizable double bond and carboxyl group, hydroxyl group, hydroxymethyl group, amino group, sulfonic acid group, a polyethylene oxide group, a sulfuric acid ester salt group, a phosphoric acid ester salt group or the like and so forth can be used. For example, one or two or more kinds of monomers selected from "(meth)acrylates having hydroxyl group such as 2-hydroxylethyl(meth)acrylate and 2-hydroxypropyl (meth)acrylate", "ethylenically unsaturated carboxylic acids such as acrylic acid and methacrylic acid containing carboxyl group, maleic acid or a monoalkyl ester thereof, itaconic acid or a monoalkyl ester thereof, and fumaric acid or a monoalkyl ester thereof", "(meth)acrylamides such as acrylamide, N-methylol(meth)acrylamide, dimethylol(meth)acrylamide, N-methylolpropane(meth)acrylamide and N,N-dimethylacrylamide", "alkylamino esters of acrylic acid or methacrylic acid such as N-methylaminoethyl methacrylate, N-methylaminoethyl acrylate, dimethylaminoethyl methacrylate, dimethylaminoethyl acrylate, diethylaminoethyl methacrylate and diethylaminoethyl acrylate", "unsaturated amides having an alkylamino group such as N-(2-dimethylaminoethyl)acrylamide, N-(2-dimethylaminoethyl)methacrylamide and N,N-dimethylaminopropylacrylamide", "monovinylpyridines such as vinylpyridine", "vinyl ethers having an alkylamino group such as dimethylaminoethyl vinyl ether", "those having sulfonic acid group such as vinylsulfonic acid, styrenesulfonic acid and a salt thereof, 2-acryloylamino-2-methylpropanesulfonic acid and a salt thereof", "vinylpyrrolidone", "(meth)acrylic acid", and so forth can be used.

Among these, monomers having (meth)acrylic group showing superior catalyst adhering property and anti-discoloration property for plate layer are preferred, and further among such monomers, (meth)acrylates having hydroxyl group and N-methylol(meth)acrylamides are especially preferred.

Further, self-crosslinkable monomers such as N-methylol (meth)acrylamide, dimethylol(meth)acrylamide and N-methylolpropane(meth)acrylamide self-crosslink when they are heated. Therefore, catalyst adhering property and anti-dissolution property of the catalyst adhering layer can be controlled according to the stage of the production process by crosslinking. For example, only a part of N-methylol(meth) acrylamide is crosslinked before adhering the catalyst (non-crosslinked N-methylol(meth)acrylamide is saved), and crosslinking of the non-crosslinked N-methylol(meth)acrylamide is advanced after adhering the catalyst. Thereby, dissolution of the catalyst into the plating bath can be prevented while favorable adhesion of the catalyst is obtained, and insulation property of the catalyst adhering layer can be improved accompanied with the advance of crosslinking.

Further, use of a self-crosslinkable monomer such as N-methylol(meth)acrylamide makes a plate layer formed by electroless plating and a plate layer formed by subsequent electrolytic plating crack-resistant, and improves thus durability of the plate layers.

Moreover, when the hydrophilic monomer is a self-crosslinkable monomer, it shows more favorable catalyst adhering property compared with a hydrophobic monomer even after the self-crosslinking, since it is originally a hydrophilic monomer. Therefore, it become easier to obtain the catalyst adhering layer showing superior catalyst adhering property as well as superior dissolution preventing property and insulating property. In the case where a self-crosslinkable monomer is used as the hydrophilic monomer, such a self-crosslinkable monomer is preferably used in combination of another hydrophilic monomer in order to prevent hydrophilicity of the layer from becoming insufficient due to advance of self-crosslinking at the time of formation of the catalyst adhering layer.

As the hydrophobic monomer, those having a polymerizable double bond and a lipophilic hydrocarbon group, aromatic ring group or alicyclic group and so forth can be used. For example, one or two or more kinds of monomers selected from "alkyl(meth)acrylates such as methyl(meth)acrylate, ethyl(meth)acrylate, N-butyl(meth)acrylate, isobutyl(meth)acrylate, N-hexyl(meth)acrylate, 2-ethylhexyl(meth)acrylate, octyl(meth)acrylate and decyl(meth)acrylate", "glycidyl (meth)acrylate", "aromatic vinyl compounds such as styrene, 2-methylstyrene, vinyltoluene, t-butylstyrene, chlorostyrene, vinylanisole, vinylnaphthalene and divinylbenzene", "vinylidene halides such as vinylidene chloride and vinylidene fluoride", ethylene, propylene, isopropylene, butadiene, vinyl chloride, vinyl ether, vinyl ketone, chloroprene, acrylonitrile, methacrylonitrile, and so forth can be used.

Among these, monomers having (meth)acrylic group showing superior catalyst adhering property and anti-discoloration property for plate layers are preferred, and further among such monomers, alkyl(meth)acrylates are especially preferred. Moreover, glycidyl(meth)acrylate is self-crosslinkable like N-methylol(meth)acrylamide exemplified as the hydrophilic monomer, and it is preferred since it can exhibit effects similar to those of N-methylol(meth)acrylamide mentioned above, namely, improvement of insulating property and crack preventing effect for plate layers.

Although those hydrophilic monomers and the hydrophobic monomers mentioned above can be used, as at least one of the monomers, a monomer having (meth)acrylic group is used. In order to obtain favorable catalyst adhering property and discoloration preventing property for plate layers, such a monomer having (meth)acrylic group is preferably used in an amount of 50 mol % or more, more preferably 60 mol % or more, base on the total monomers constituting the hydrophilic (meth)acrylic resin.

Although the monomer having (meth)acrylic group may be either a hydrophilic monomer or a hydrophobic monomer, it is preferred that the hydrophilic monomer contains a monomer having (meth)acrylic group, and it is more preferred that both the hydrophilic monomer and the hydrophobic monomer contain a monomer having (meth)acrylic group, in view of catalyst adhering property and anti-discoloration property for plate layers.

As for ratio of the hydrophilic monomer and the hydrophobic monomer constituting the hydrophilic (meth)acrylic resin, the hydrophobic monomer is used in a ratio of 50 to 90 mol %, preferably 50 to 80 mol %. With a ratio of the hydrophobic monomer of 50 mol % or more, dissolution of the catalyst adhering layer into a plating solution or a catalyst solution can be prevented, thereby life of the plating solution or catalyst solution can be prolonged, and blackening of plate can be prevented. With a ratio of the hydrophobic monomer of 90 mol % or less, adhesion of the catalyst to the catalyst adhering layer can be made favorable.

Examples of the hydrophilic (meth)acrylic resin include a resin obtained by copolymerization of the aforementioned hydrophilic monomer and hydrophobic monomer, and a comb resin formed by copolymerization of a macromonomer synthesized from one of the monomers (hydrophilic monomer or hydrophobic monomer) and serving as branch moieties, and the other monomer serving as a backbone. Among these, the comb resin is preferred, which can provides superior dissolution preventing property of catalyst adhering layer by entanglement of the molecules.

The comb resin can be divided into those having a backbone consisting of hydrophilic monomers and branches consisting of hydrophobic monomers and those having a backbone consisting of hydrophobic monomers and branches consisting of hydrophilic monomers, and the latter type is preferred. By obtaining hydrophilicity with the branch moieties, not the backbone serving the basic structure, as in the latter type resin, it become easier to simultaneously obtain improvement of hydrophilicity for improving catalyst adhering property, and the incompatible performance, prevention of dissolution of the catalyst adhering layer.

The hydrophilic (meth)acrylic resin preferably has a number average molecular weight of 3,000 to 80,000. With a number average molecular weight of 3,000 or larger, it can be easily made into a coating, and with a number average molecular weight of 80,000 or smaller, a viscosity providing good workability can be obtained.

The catalyst adhering layer may contain a resin other than the hydrophilic (meth)acrylic resin mentioned above. Examples of such a resin include, for example, polyvinylbutyral, polyester resin, polyurethane resin, and so forth. Although the resin other than the hydrophilic (meth)acrylic resin may be hydrophilic or hydrophobic, it is preferably water-insoluble, in order to prevent dissolution. Even when the other resin is contained, the hydrophilic (meth)acrylic resin mentioned above is preferably contained in an amount of 50% by weight or more, more preferably 80% by weight or more, still more preferably 90% by weight or more, based on the total resin constituting the catalyst adhering layer.

Although thickness of the catalyst adhering layer cannot be generally defined, since it may vary depending on types of monomers constituting the hydrophilic (meth)acrylic resin and so forth, it is preferably 0.05 to 3 μm, more preferably 0.05 to 0.5 μm. With a thickness of 0.05 μm or larger, it can be made easier to adhere the catalyst, and with a thickness of 3 μm or smaller, it is possible to prevent delamination of the catalyst adhering layer due to invasion of a developer from the side at the time of the pattern formation mentioned later and degradation of insulating property of the catalyst adhering layer. Further, with a thickness of 0.5 μm or smaller, the electroless plate and electrolytic plate formed on the catalyst adhering layer can be made more crack resistant.

The catalyst adhering layer can be formed by applying a coating solution dissolving materials constituting the layer such as the resin in an appropriate solvent on the non-conductive base material by a known coating method such as bar coating, and drying the solution, molding of the non-conductive base material and the catalyst adhering layer by co-extrusion of the materials constituting them, or the like. The catalyst adhering layer does not need to be formed over the whole surface of the non-conductive base material, and it may be formed over a part of it. By providing the catalyst adhering layer over a part of the non-conductive base material, the catalyst can be selectively adhered to the part of the non-conductive base material, and thus the electroless plating and electrolytic plating can be selectively performed on that part.

The coating solution for forming the catalyst adhering layer, explained above as an element of the material for forming electroless plate of the present invention, may be a coating solution for adhering catalyst for adhering a catalyst for electroless plating by applying it to an arbitrary material to be plated. By applying this coating solution for adhering catalyst on an arbitrary material to be plated consisting of a material similar to that of the non-conductive base material mentioned above, or immersing the material to be plated in the coating solution for adhering catalyst, the catalyst adhering layer is formed to produce the material for forming electroless plate.

As described above, the material for forming electroless plate of the present invention, or a material to be plated on which a catalyst adhering layer is formed on the surface with the coating solution for adhering catalyst of the present invention contains a hydrophilic (meth)acrylic resin constituted with a hydrophilic monomer and a hydrophobic monomer and containing the hydrophobic monomer at a ratio of 50 to 90 mol % in the catalyst adhering layer, and therefore it shows favorable catalyst adhering property, no delamination of the catalyst adhering layer from the non-conductive base material, no dissolution of the catalyst adhering layer into a plating solution or a catalyst solution, and no discoloration of plate layer.

In particular, by using a self-crosslinkable monomer as at least one of the hydrophilic monomer and the hydrophobic monomer, dissolution of the catalyst adhering layer into an electroless plating bath or an electrolytic plating bath can be prevented with maintaining favorable catalyst adhering property thereof, and formed electroless plate layer and plate layer can be made more crack resistant.

Hereafter, embodiments of the method for forming an electroless plate and plating method of the present invention will be explained below.

The method for forming an electroless plate and plating method of the present invention are characterized by using the material for forming electroless plate or coating solution for adhering catalyst of the present invention described above, and comprises first adhering a catalyst to the catalyst adhering layer of the material for forming electroless plate, or a material to be plated on which the coating solution for adhering catalyst is applied.

As the fine metal particles having a catalytic activity for electroless plating (catalyst), those of gold, silver, ruthenium, rhodium, palladium, tin, iridium, osmium, platinum and so forth and mixtures thereof can be used. The catalyst is preferably used as a colloidal solution. Generally used as the method for the preparation of colloidal solution of the catalyst is a method of dissolving a water-soluble salt containing the catalyst in water, adding a surfactant to the solution, and adding a reducing agent to the mixture with vigorous stirring. However, other known methods may also be used.

Examples of the method for adhering the catalyst to the catalyst adhering layer of the material for forming electroless plate include a method of successively performing a sensitization treatment (sensitizing) and an activation treatment (activating) by using a colloidal solution of the catalyst, and a method of successively performing catalyzing and accelerating. Since a resin showing superior catalyst adhering property is used for the catalyst adhering layer in the present invention, the catalyst adhesion step can be completed in an extremely short period of time, and thereby dissolution of the catalyst adhering layer into the catalyst solution can be prevented.

It is preferable to subject the material for forming electroless plate to a degreasing treatment which is performed by washing with an acid and/or alkali before the catalyst is adhered to the catalyst adhering layer. Since a hydrophilic resin is used for the catalyst adhering layer in the present invention, the degreasing treatment can also be completed in an extremely short period of time.

In general, as well as the degreasing treatment, conditioning and pre-dipping steps are generally performed before a catalyst is adhered to the catalyst adhering layer. However, those steps may be omitted in the present invention because a resin showing superior wetting property is used for the catalyst adhering layer.

After the catalyst is adhered to the catalyst adhering layer, electroless plating is performed. The electroless plating can be performed by, for example, immersing the material for forming electroless plate, on which the catalyst is adhered, in an electroless plating bath containing a water-soluble compound of a metal to be plated (usually metal salt), a complexing agent, a pH adjustor, a reducing agent and a plating aid. By adjusting various conditions such as bath composition, temperature, pH and immersion time, thickness of the electroless plate can be controlled.

Examples of the metal to be plated by the electroless plating including non-electrolytic copper, non-electrolytic nickel, non-electrolytic copper/nickel/phosphorus alloy, non-electrolytic nickel/phosphorus alloy, non-electrolytic nickel/boron alloy, non-electrolytic cobalt/phosphorus alloy, non-electrolytic gold, non-electrolytic silver, non-electrolytic palladium, non-electrolytic tin and so forth.

As the complexing agent, pH adjustor, plating aid and reducing agent, those conventionally known as these can be used.

After an electroless plate is formed, electrolytic plating is performed as required. It is preferable to advance crosslinking in the catalyst adhering layer prior the electrolytic plating. Crosslinking is advanced by, for example, heating of the material for forming electroless plate after adhering the catalyst. Specifically, by heating the material at 90 to 130° C. for about 5 to 60 minutes, the catalyst adhering layer can be substantially completely self-crosslinked. When it is crosslinked stepwise, the material may be heated first at 60 to 100° C. for about 0.5 to 5 minutes, and then at 90 to 130° C. for about 5 to 60 minutes.

When the monomers constituting the hydrophilic (meth)acrylic resin of the catalyst adhering layer contain a self-crosslinkable monomer, crosslinking advances to a certain extent even without heating. However, crosslinking can be promoted by heating to prevent dissolution of the catalyst adhering layer into an electroless plating bath and plating bath, and improve insulating property. Moreover, since hardness of the catalyst adhering layer is also thereby increased, cracks of the electroless plating layer and the plate layer can be prevented.

Although timing of advancing crosslinking is not particularly limited, in order to prevent cracks of the plate layer, crosslinking is preferably advanced after the catalyst is adhered to the catalyst adhering layer, and before electrolytic plating is performed. For example, crosslinking can be advanced immediately before the electroless plating or electrolytic plating.

The electrolytic plating can be performed by immersing the material for forming electroless plate on which electroless plate is formed in a known electrolytic plating bath and electrifying it. By adjusting current density and electrification time, thickness of the electrolytic plate can be controlled.

After the electrolytic plate is formed, pattern formation may be performed as required. The pattern formation can be performed by, for example, applying a photoresist to the electrolytic plate, performing exposure and removing the photoresist of exposed or unexposed portions with a developer together with the electrolytic plate, the electroless plate and the catalyst adhering layer.

The material for forming electroless plate on which electroless plate or electroless plate and electrolytic plate are formed as described above can be used for printed wiring boards, electromagnetic wave shielding members, sheet type heating elements, antistatic sheets, antennas, and so forth.

Examples

Hereafter, the present invention will be further explained with reference to examples. The term "part" and the symbol "%" are used on the weight basis, unless specifically indicated.

1. Synthesis of Hydrophilic (Meth)Acrylic Resin

In a reaction vessel provided with a condenser tube and a stirring device, a hydrophilic monomer and a hydrophobic monomer were mixed at a ratio shown in Table 1 (unit is "mol"), and ethyl acetate was further added to the mixture as a dilution solvent to obtain a reaction monomer concentration of 50%. Then, the inside of the reaction vessel was sufficiently replaced with nitrogen gas, and the temperature of the reaction solution was elevated to 60 to 90° C. by heating on an oil bath. After the heating, a polymerization initiator was added to the reaction mixture in an amount of 0.15% based on the amount of monomers, and the reaction was continued for 6 to 8 hours to allow copolymerization and thereby obtain each of hydrophilic (meth)acrylic resins a to u (solid content: 50%). In Table 1, HEMA represents 2-hydroxylethyl methacrylate monomer, N-MAM represents N-methylolacrylamide monomer, AA represents acrylic acid monomer, MMA represents methyl methacrylate monomer, MA represents methyl acrylate monomer, and St represents styrene monomer.

TABLE 1

|  | Hydrophilic monomer | | | Hydrophobic monomer | | |
| --- | --- | --- | --- | --- | --- | --- |
|  | HEMA | N-MAM | AA | MMA | MA | St |
| Resin a | 50 | — | — | 50 | — | — |
| Resin b | 20 | — | — | 80 | — | — |
| Resin c | 10 | — | — | 90 | — | — |
| Resin d | — | — | 50 | 50 | — | — |
| Resin e | — | — | 20 | 80 | — | — |
| Resin f | 50 | — | — | — | 25 | 25 |
| Resin g | 20 | — | — | — | 40 | 40 |
| Resin h | . | — | 50 | — | 25 | 25 |
| Resin i | . | — | 20 | — | 40 | 40 |
| Resin j | . | 50 | — | 50 | — | — |
| Resin k | . | 20 | — | 80 | — | — |
| Resin l | 60 | — | — | 40 | — | — |
| Resin m | 5 | — | — | 95 | — | — |
| Resin n | — | — | 60 | 40 | — | — |
| Resin o | — | — | 5 | 95 | — | — |
| Resin p | 60 | — | — | — | 20 | 20 |
| Resin q | 5 | — | — | — | 47.5 | 47.5 |
| Resin r | — | — | 60 | — | 20 | 20 |
| Resin s | — | — | 5 | — | 47.5 | 47.5 |
| Resin t | — | 60 | — | 40 | — | — |
| Resin u | — | 5 | — | 95 | — | — |

2. Production of Materials for Forming Electroless Plate of Examples and Comparative Examples <Production of Material for Forming Electroless Plate of Example 1>

On one surface of a polyester film having a thickness of 100 μm (Lumirror T60, Toray Industries, Inc.), a coating solution A for catalyst adhering layer, which was prepared by diluting the resin a with a solvent, was applied and heated at 90° C. for 3 minutes to form a catalyst adhering layer having a thickness of 1 μm, and thereby obtain a material for forming electroless plate of Example 1.

<Production of Materials for Forming Electroless Plate of Examples 2 to 11>

The materials for forming electroless plate of Examples 2 to 11 were obtained in the same manner as that of Example 1 except that the resin a was changed to the resins b to k, respectively.

<Production of Materials for Forming Electroless Plate of Comparative Examples 1 to 10>

The materials for forming electroless plate of Comparative Examples 1 to 10 were obtained in the same manner as that of Example 1 except that the resin a was changed to the resins 1 to u, respectively.

<Production of Materials for Forming Electroless Plate of Examples 12 and 13>

The materials for forming electroless plate of Examples 12 and 13 were obtained in the same manner as that of Example 1 except that the resin a in the coating solution A for catalyst adhering layer was changed to the following resins, respectively.

<<Resin of Example 12>>

Hydrophilic (meth)acrylic resin (CHEMTREE L-40M, Soken Chemical & Engineering Co., Ltd., comb resin, ratio of hydrophobic monomer: 86 mol %, branch components: N-MAM and HEMA (both are hydrophilic monomers), backbone component: MMA (hydrophobic monomer))<

<<Resin of Example 13>>

Hydrophilic (meth)acrylic resin (CHEMTREE L-20, Soken Chemical & Engineering Co., Ltd., comb resin, ratio of hydrophobic monomer: 86 mol %, branch component: HEMA (hydrophilic monomer), backbone component: MMA (hydrophobic monomer))

<Production of Material for Forming Electroless Plate of Comparative Example 11)

On one surface of a polyester film having a thickness of 100 μm (Lumirror T60, Toray Industries, Inc.), a coating solution for curable layer having the following composition was applied and dried at 100° C. for 30 seconds to form a curable layer having a thickness of 1 μm. Immediately after the formation of the curable layer, a coating solution B for catalyst adhering layer having the following composition was applied on the curable layer and dried at 110° C. for 5 minutes to form a catalyst adhering layer having a thickness of 1.5 μm and thereby obtain a material for forming electroless plate of Comparative Example 11.

<<Coating Solution for Curable Layer>>

| | |
|---|---|
| Polyester resin (Vylon 200, Toyobo Co., Ltd., solid content: 100%) | 10 parts |
| Isocyanate compound (Takenate D160N, Mitsui Chemicals Polyurethane Inc.) | 1 part |
| Methyl ethyl ketone | 40 parts |
| Toluene | 40 parts |
| Cyclohexanone | 10 parts |

<<Coating Solution B for Catalyst Adhering Layer>>

| | |
|---|---|
| Polyvinyl alcohol (Gohsenol NH20, Nippon Synthetic Chemical Industry Co., Ltd.) | 1 part |
| Water | 9 parts |

<Production of Material for Forming Electroless Plate of Comparative Example 12>

A material for forming electroless plate of Comparative Example 12 was obtained in the same manner as that of Comparative Example 11 except that the polyester resin contained in the coating solution for curable layer of Comparative Example 11 was changed to another polyester resin (Elitel UE3350, Unitika, Ltd., solid content: 100%), and the amount of the isocyanate compound was changed to 14 parts.

The following steps (1) to (4) were performed for the materials for forming electroless plate of Examples 1 to 13 and Comparative Examples 1 to 12 to form an electroless plate and an electrolytic plate on the catalyst adhering layer of each material for forming electroless plate.

(1) Degreasing Treatment

A degreasing treatment was performed for 60 seconds by using an aqueous alkaline solution.

(2) Adhesion of Catalyst

A sensitization treatment and an activation treatment were successively performed for 60 seconds and 30 seconds, respectively, by using a mixed colloidal solution of palladium and tin as a catalyst bath.

(3) Electroless Plating

Electroless plating was performed by using an electroless plating bath having the following composition under conditions of a bath temperature of 60° C. and an immersion time of 15 minutes.

<<Electroless Plating Bath>>

| | |
|---|---|
| Copper sulfate pentahydrate | 0.03M |
| EDTA tetrahydrate | 0.24M |
| Formalin | 0.20M |
| Dipyridyl | 10 ppm |
| Surfactant | 100 ppm |

(4) Electrolytic Plating

Electrolytic plating was performed by using a copper sulfate plating bath (CU-BRITE TH Process, Ebara Udylite Co., Ltd.) as an electrolytic plating bath until the plate thickness became about 30 μm.

The materials for forming electroless plate of Examples 1 to 13 and Comparative Examples 1 to 12 on which electroless plate and electrolytic plate were formed were evaluated for the following items. Discoloration of the plate layers was evaluated immediately after formation of the electroless plate. The results are shown in Table 2.

(1) Uniformity of Plate

Whether the plate was uniformly formed or not was evaluated by visual inspection. The results that plate was uniformly formed without unevenness are indicated with "○" and the results that plate showed unevenness and was not uniformly formed are indicated with "X".

(2) Adhesion

Each plated surface was cut so that 100 grids should be formed with 1 mm-gaps between them, cellophane adhesive tape was stuck on a cut part of the surface and removed, and then ratio of area where the layers (electrolytic plate, electroless plate, catalyst adhering layer, curable layer) still adhered to the non-conductive base material was evaluated by visual inspection.

(3) Dissolution Preventing Property

Each material was immersed in purified water for 10 minutes, then taken out and sufficiently dried, and weight change of the material relative to that observed before the immersion was measured. The results of no weight change, namely, no dissolution of the catalyst adhering layer, are indicated with "○", and the results of dissolution of 20% by weight or more of the catalyst adhering layer are indicated with "X".

(4) Discoloration of Plate Layer

Color of the plate layer was observed from the base material side immediately after the electroless plating was performed. The results of clear copper color of the plate layer are indicated with "○", and the results of blackened color are indicated with "X".

TABLE 2

| | Uniformity | Adhesion | Dissolution preventing property | Discoloration |
|---|---|---|---|---|
| Example 1 | ○ | 100% | ○ | ○ |
| Example 2 | ○ | 90% | ○ | ○ |
| Example 3 | ○ | 80% | ○ | ○ |
| Example 4 | ○ | 100% | ○ | ○ |
| Example 5 | ○ | 90% | ○ | ○ |
| Example 6 | ○ | 100% | ○ | ○ |
| Example 7 | ○ | 90% | ○ | ○ |
| Example 8 | ○ | 100% | ○ | ○ |
| Example 9 | ○ | 90% | ○ | ○ |
| Example 10 | ○ | 100% | ○ | ○ |
| Example 11 | ○ | 90% | ○ | ○ |
| Example 12 | ○ | 85% | ○ | ○ |
| Example 13 | ○ | 85% | ○ | ○ |
| Comp. Example 1 | ○ | 100% | X | ○ |
| Comp. Example 2 | ○ | 10% | ○ | ○ |
| Comp. Example 3 | ○ | 100% | X | ○ |
| Comp. Example 4 | ○ | 10% | ○ | ○ |
| Comp. Example 5 | ○ | 100% | X | ○ |
| Comp. Example 6 | ○ | 20% | ○ | ○ |
| Comp. Example 7 | ○ | 100% | X | ○ |
| Comp. Example 8 | ○ | 20% | ○ | ○ |
| Comp. Example 9 | ○ | 100% | X | ○ |
| Comp. Example 10 | ○ | 0% | ○ | ○ |
| Comp. Example 11 | ○ | 100% | ○ | X |
| Comp. Example 12 | ○ | 100% | ○ | X |

*Comp. Example: Comparative Example

Since the catalyst adhering layers of the materials for forming electroless plate of Examples 1 to 13 contained a hydrophilic (meth)acrylic resin constituted with a hydrophilic monomer and a hydrophobic monomer and containing the hydrophobic monomer at a ratio of 50 to 90 mol %, these materials showed superior catalyst adhering property ("Uniformity" and "Adhesion" of the aforementioned results), and superior dissolution preventing property of the catalyst adhering layer, and they also showed no discoloration of the plate layers at the interfaces with the catalyst adhering layers.

On the other hand, although the catalyst adhering layers of the materials for forming electroless plate of Comparative Examples 1, 3, 5, 7 and 9 contained a hydrophilic (meth) acrylic resin constituted with a hydrophilic monomer and a hydrophobic monomer, the ratio of the hydrophobic monomer was less than 50 mol %, and therefore the catalyst adhering layers were dissolved.

Although the catalyst adhering layers of the materials for forming electroless plate of Comparative Examples 2, 4, 6, 8 and 10 contained a hydrophilic (meth)acrylic resin constituted with a hydrophilic monomer and a hydrophobic monomer, the ratio of the hydrophobic monomer exceeded 90 mol %, and therefore they did not show sufficient catalyst adhering property ("Adhesion" in the aforementioned results).

Since the catalyst adhering layers of the materials for forming electroless plate of Comparative Examples 11 and 12 did not contain hydrophilic (meth)acrylic resin, the plate layers were blackened at the interfaces with the catalyst adhering layers.

The materials for forming electroless plate of Examples 1 to 13 were further evaluated for insulating property and cracking of the formed plate layers.

(5) Evaluation of Insulating Property

Each of the materials for forming electroless plate of Examples 1 to 13 was additionally heated at 130° C. for 5 minutes after the electroless plate was formed, and then electrolytic plate was formed. After the electrolytic plate was formed, a resist film was further applied to the plated surface, a pattern was formed by etching with an acid, and then the resist film was delaminated with an alkali. Then, surface resistivity (JIS K7194:1994) of the catalyst adhering layer exposed by removal of the plate pattern by etching was measured.

In the materials for forming electroless plate of Examples 10 to 12, self-crosslinking of N-methylolacrylamide in the hydrophilic (meth)acrylic resin in the catalyst adhering layers was further advanced by the additional heat treatment, therefore the surface resistivity elevated to the order of $10^{14}$ from the level of $10^{11}$ order observed without the additional heat treatment, and thus insulating property could be improved. In the materials for forming electroless plate of Examples 1 to 9 and 13, change in surface resistivity was not observed even after the additional heat treatment was performed.

(6) Evaluation of Cracking of Plate

Cracking of the electrolytic plated surfaces of the materials for forming electroless plate of Examples 1 to 13 was observed, in which materials electrolytic plate was formed after the additional heat treatment as described above. The materials for forming electroless plate of Examples 10 to 12 in which self-crosslinking advanced showed substantially no crack, and thus superiority of these materials was demonstrated over the materials for forming electroless plate of Examples 1 to 9 and 13 in which self-crosslinking did not advance.

<Production of Materials for Forming Electroless Plate Having Different Thickness>

The materials for forming electroless plate of Examples 1 to 13 were prepared again with changing the thickness of the catalyst adhering layer (1.0 μm) to 0.7, 0.5, 0.2 and 0.05 μm, subjected to electroless plating under the same conditions as those of Examples 1 to 13, and then subjected to electrolytic plating without carrying out the additional heat treatment, and cracking of the electrolytic plate surfaces was observed. As a result, it was confirmed that the surface of the catalyst adhering layer became more resistant to cracking as the catalyst adhering layer became thinner.

The invention claimed is:

1. A material for forming electroless plate comprising a non-conductive base material and a catalyst adhering layer provided on the non-conductive base material, wherein the catalyst adhering layer comprises a hydrophilic (meth)acrylic resin constituted with a hydrophilic monomer and a hydrophobic monomer and containing the hydrophobic monomer at a ratio of 50 to 90 mol %.

2. The material for forming electroless plate according to claim 1, wherein at least one of the hydrophilic monomer and the hydrophobic monomer is a self-crosslinkable monomer.

3. The material for forming electroless plate according to claim 1, wherein the hydrophilic monomer is a (meth)acrylate having hydroxyl group or N-methylol(meth)acrylamide.

4. The material for forming electroless plate according to claim 1, wherein the hydrophobic monomer is an alkyl(meth) acrylate.

5. The material for forming electroless plate according to claim 1, wherein the hydrophilic (meth)acrylic resin is a comb resin.

6. The material for forming electroless plate according to claim 1, wherein the catalyst adhering layer contains the hydrophilic (meth)acrylic resin in an amount of 50% by weight or more of the total resin constituting the catalyst adhering layer.

7. A coating solution for adhering a catalyst for electroless plating to a non-conductive base material, which comprises a hydrophilic (meth)acrylic resin constituted with a hydrophilic monomer and a hydrophobic monomer and containing the hydrophobic monomer at a ratio of 50 to 90 mol %.

8. A method for forming an electroless plate, which comprises adhering a catalyst to the catalyst adhering layer of the material for forming electroless plate according to claim 1, and then performing electroless plating.

9. A method for plating a non-conductive base material comprising a step (1) of adhering a catalyst to a catalyst adhering layer of a material for forming electroless plate comprising the non-conductive base material and the catalyst adhering layer provided on the non-conductive base material, a step (2) of immersing the material for forming electroless plate adhered with the catalyst in an electroless plating solution containing a compound of a metal to be plated and performing electroless plating, and a step (3) of immersing the material for forming electroless plate on which electroless plate is formed in an electrolytic plating bath and performing electrolytic plating by electrifying it, wherein the material for forming electroless plate according to claim 1 is used as the material for forming electroless plate.

10. A method for plating a non-conductive base material comprising a step (1) of adhering a catalyst to a catalyst adhering layer of a material for forming electroless plate comprising the non-conductive base material and the catalyst adhering layer provided on the non-conductive base material, a step (2) of immersing the material for forming electroless plate adhered with the catalyst in an electroless plating solution containing a compound of a metal to be plated and performing electroless plating, and a step (3) of immersing the material for forming electroless plate on which electroless plate is formed in an electrolytic plating bath and performing electrolytic plating by electrifying it, wherein a material for forming electroless plate in which a catalyst adhering layer is formed by applying the coating solution for adhering catalyst according to claim 7 on a surface of a non-conductive base material is used as the material for forming electroless plate.

11. The plating method according to claim 10, which comprises a step (4) of heating the material for forming electroless plate to advance crosslinking of the hydrophilic (meth)acrylic resin.

12. The plating method according to claim 11, wherein the step (4) is performed after the step (1) and before the step (3).

13. The plating method according to claim 9, which comprises a step (4) of heating the material for forming electroless plate to advance crosslinking of the hydrophilic (meth)acrylic resin.

14. The plating method according to claim 13, wherein the step (4) is performed after the step (1) and before the step (3).

* * * * *